US012052061B2

United States Patent
Jakobsson et al.

(10) Patent No.: US 12,052,061 B2
(45) Date of Patent: Jul. 30, 2024

(54) MITIGATION OF LOCAL OSCILLATOR LEAKAGE

(71) Applicant: Telefonaktiebolaget LM Ericsson (publ), Stockholm (SE)

(72) Inventors: Peter Jakobsson, Lund (SE); Lars Sundström, Lund (SE)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 23 days.

(21) Appl. No.: 18/000,898

(22) PCT Filed: Jun. 9, 2020

(86) PCT No.: PCT/EP2020/065977
§ 371 (c)(1),
(2) Date: Dec. 6, 2022

(87) PCT Pub. No.: WO2021/249626
PCT Pub. Date: Dec. 16, 2021

(65) Prior Publication Data
US 2023/0224049 A1 Jul. 13, 2023

(51) Int. Cl.
*H04B 15/06* (2006.01)
*H03L 7/099* (2006.01)

(52) U.S. Cl.
CPC ............ *H04B 15/06* (2013.01); *H03L 7/099* (2013.01)

(58) Field of Classification Search
CPC .. H04L 7/00; H04B 1/38; H04B 15/06; H03L 7/07; H03L 7/099

(Continued)

(56) References Cited

U.S. PATENT DOCUMENTS 6,411,256 B1 6/2002 Lier et al.
10,291,242 B1 * 5/2019 Elbadry ................. H03L 7/099
(Continued)

FOREIGN PATENT DOCUMENTS

| EP | 1655642 A2 | 5/2006 |
| EP | 3353912 B1 | 7/2019 |
| WO | 2017052927 A1 | 3/2017 |

OTHER PUBLICATIONS

International Search Report and Written Opinion dated Mar. 4, 2021 for International Application No. PCT/EP2020/065977 filed Jun. 9, 2020, consisting of 8 pages.

*Primary Examiner* — Emmanuel Bayard
(74) *Attorney, Agent, or Firm* — Weisberg I.P. Law. P.A.

(57) ABSTRACT

An apparatus for a multi-antenna transceiver is disclosed. The multi-antenna transceiver has a plurality of antenna elements connected to respective transceiver chains. Each transceiver chain includes a frequency converter operated using a respective local oscillator signal provided by a respective phase-locked loop. The apparatus includes a controller configured to cause control of the respective phase-locked loop of one or more transceiver chain to generate the respective local oscillator signal with a respective phase offset for mitigation of local oscillator leakage through the frequency converter. In some embodiments, the controller is further configured to cause, for each transceiver chain with a non-zero respective phase offset, a corresponding phase adjustment of a signal for frequency conversion. Corresponding multi-antenna transceivers, wireless communication devices and methods are also disclosed.

21 Claims, 4 Drawing Sheets

(58) Field of Classification Search
USPC .................. 375/219–220, 346, 371, 376
See application file for complete search history.

(56) References Cited

U.S. PATENT DOCUMENTS

| | | | |
|---|---|---|---|
| 10,958,389 B2* | 3/2021 | Moshfeghi | H04L 27/12 |
| 11,552,405 B1* | 1/2023 | Bily | H01Q 21/061 |
| 2005/0047384 A1* | 3/2005 | Wax | H04W 72/046 |
| | | | 455/561 |
| 2020/0300965 A1* | 9/2020 | Wu | G01S 13/505 |
| 2021/0067182 A1* | 3/2021 | Ravi | H04B 1/0475 |
| 2021/0175850 A1* | 6/2021 | Yin | H03L 7/099 |
| 2021/0192156 A1* | 6/2021 | Koch | G06K 7/10346 |
| 2022/0050162 A1* | 2/2022 | Zand | H04W 4/026 |
| 2022/0099795 A1* | 3/2022 | Crouch | G01S 13/003 |

* cited by examiner (a)

(b)

(c)

MITIGATION OF LOCAL OSCILLATOR LEAKAGE

CROSS-REFERENCE TO RELATED APPLICATIONS

This application is a Submission Under 35 U.S.C. § 371 for U.S. National Stage Patent Application of International Application Number: PCT/EP2020/065977, filed Jun. 9, 2020 entitled "MITIGATION OF LOCAL OSCILLATOR LEAKAGE," the entirety of which is incorporated herein by reference.

TECHNICAL FIELD

The present disclosure relates generally to the field of wireless communication. More particularly, it relates to mitigation of local oscillator leakage for a multi-antenna transceiver.

BACKGROUND

A local oscillator (LO) is typically used in transceivers to provide the reference signal for frequency conversion (e.g., up-conversion and/or down-conversion). A problem arises due to that the local oscillator signal can partly leak through the frequency conversion. Such local oscillator signal leakage may manifest itself as an (undesired) centered signal component at the output of the frequency conversion. In the receiver frequency conversion, the centered signal component will typically comprise a direct current (DC) signal component. In the transmitter frequency conversion, the centered signal component will typically comprise a signal component at carrier frequency.

Various problems may arise due to local oscillator signal leakage.

For example, depending on transceiver architecture, the LO signal leakage may—or may not—appear on the same frequency as the wanted signal. When the LO signal leakage appears on the same frequency as the wanted signal (e.g., typical for direct up-conversion) an error vector magnitude (EVM) degradation may result. The EVM degradation may typically be higher when the LO signal leakage adds coherently in the spatial direction used by a communication beam than otherwise.

More broadly, problems due to local oscillator signal leakage include, for example, that general performance degradation of the communication—compared to if there was no local oscillator signal leakage—may be experienced (e.g., one or more of: decreased signal-to-interference ratio (SIR), decreased throughput, decreased peak rate, decreased capacity, etc.).

One approach to mitigate local oscillator signal leakage is by tracking the centered signal component and suppress it by addition of a cancellation signal. In a receiver path, the tracking of the centered signal component and the addition of the cancellation signal may typically be implemented after down-conversion. In a transmitter path, the tracking of the centered signal component and the addition of the cancellation signal may typically be implemented before up-conversion.

However, tracking the centered signal may be challenging or cumbersome in some scenarios. For example, tracking using the radio frequency signal after up-conversion is challenging.

In addition, any mismatch between the local oscillator leakage and the cancellation signal may be detrimental to performance.

Furthermore, this approach is not particularly suitable when information to be communicated is carried by a centered signal component, since such information might be adversely affected by the suppression.

U.S. Pat. No. 6,411,256 B1 describes reduction of local oscillator (LO) spurious radiation from spacecraft-based phased array transmit antennas (e.g., satellite antenna spurious emissions), by spreading a substantial portion of the radiation outside of the earth disc. The spreading is accomplished by adjusting the phase of the LO signal to a specific value in each elemental path, using insertion, in every other elemental path, of a transmission line having a length of half a wavelength in the LO signal path prior to entering the mixer.

The solution of U.S. Pat. No. 6,411,256 B1 is static and is not suitable in beam-forming scenarios where the spatial direction of communication varies quickly and/or over a wide angular space.

Therefore, there is a need for alternative approaches to mitigation of local oscillator leakage.

SUMMARY

It should be emphasized that the term "comprises/comprising" (replaceable by "includes/including") when used in this specification is taken to specify the presence of stated features, integers, steps, or components, but does not preclude the presence or addition of one or more other features, integers, steps, components, or groups thereof. As used herein, the singular forms "a", "an" and "the" are intended to include the plural forms as well, unless the context clearly indicates otherwise.

Generally, when an arrangement is referred to herein, it is to be understood as a physical product; e.g., an apparatus. The physical product may comprise one or more parts, such as controlling circuitry in the form of one or more controllers, one or more processors, or the like.

It is an object of some embodiments to solve or mitigate, alleviate, or eliminate at least some of the above or other disadvantages.

A first aspect is an apparatus for a multi-antenna transceiver, the multi-antenna transceiver having a plurality of antenna elements connected to respective transceiver chains, wherein each transceiver chain comprises a frequency converter operated using a respective local oscillator signal provided by a respective phase-locked loop.

The apparatus comprises a controller configured to cause control of the respective phase-locked loop of one or more transceiver chain to generate the respective local oscillator signal with a respective phase offset for mitigation of local oscillator leakage through the frequency converter.

In some embodiments, the control of the respective phase-locked loop comprises dynamic adjustment of the respective phase offset.

In some embodiments, the respective phase offset is in relation to the respective local oscillator signal of at least one other transceiver chain.

In some embodiments, the respective phase offset is in relation to a default local oscillator signal of the transceiver chain.

In some embodiments, each respective phase-locked loop is associated with a respective variable delay element, and the controller is configured to cause the control of the respective phase-locked loop by controlling the delay of the variable delay element.

In some embodiments, the respective variable delay element is arranged at an input of the respective phase-locked loop and is configured to delay a reference signal input of the respective phase-locked loop.

In some embodiments, the respective variable delay element is arranged at an output of the respective phase-locked loop and is configured to delay the respective local oscillator signal of the respective phase-locked loop.

In some embodiments, the respective variable delay element is arranged within the respective phase-locked loop and is configured to delay a feedback signal of the respective phase-locked loop.

In some embodiments, the controller is configured to cause the control of the respective phase-locked loop by causing one or more of: a shift in time of a control word sequence of a divider of the respective phase-locked loop, and an addition of an offset to an output of a phase comparator of the respective phase-locked loop.

In some embodiments, the control of the respective phase-locked loop is responsive to a spatial direction of a communication beam of the multi-antenna transceiver.

In some embodiments, the controller is configured to use the control of the respective phase-locked loop to cause steering of a main lobe of local oscillator leakage emission in another direction than the spatial direction of the communication beam of the multi-antenna transceiver.

In some embodiments, the controller is configured to use the control of the respective phase-locked loop to cause placing of a null of the local oscillator leakage emission in association with the spatial direction of the communication beam of the multi-antenna transceiver.

In some embodiments, the respective phase offsets of the transceiver chains are linearly increasing along an antenna array comprising the plurality of antenna elements.

In some embodiments, the control of the respective phase-locked loop is responsive to a measured spatial pattern of the local oscillator leakage emission.

In some embodiments, the controller is further configured to cause performance of measurements to determine the spatial pattern of the local oscillator leakage emission.

In some embodiments, the controller is configured to use the control of the respective phase-locked loop to cause broadening of a main lobe of local oscillator leakage emission.

In some embodiments, the controller is configured to cause generation, over time, of a sequence of different respective phase offsets for each of the transceiver chains.

In some embodiments, the respective phase offsets for the transceiver chains comprise a collection of different respective phase offsets randomly spread along an antenna array comprising the plurality of antenna elements.

In some embodiments, the different respective phase offsets comprise uniformly distributed phase offsets.

In some embodiments, the controller is further configured to cause, for each transceiver chain with a non-zero respective phase offset, a corresponding phase adjustment of a signal for frequency conversion.

In some embodiments, the phase adjustment has a same magnitude and an opposite sign as the phase offset.

In some embodiments, the phase adjustment is performed in a digital domain.

In some embodiments, the phase adjustment is, at least partly, performed in a time domain.

In some embodiments, the controller is configured to cause the phase adjustment by controlling a numerically controlled oscillator.

In some embodiments, the phase adjustment is, at least partly, performed in a frequency domain.

In some embodiments, the controller is configured to cause the phase adjustment by controlling an input to an inverse fast Fourier transformer.

In some embodiments, each transceiver chain comprises a transmitter path wherein the frequency converter is an up-converter.

A second aspect is a multi-antenna transceiver comprising the apparatus of the first aspect.

In some embodiments, the multi-antenna transceiver further comprises one or more of: the plurality of antenna elements, the respective transceiver chains, the respective phase-locked loops, and a reference local oscillator.

A third aspect is a wireless communication device comprising the multi-antenna transceiver of the second aspect.

A fourth aspect is a method for a multi-antenna transceiver having a plurality of antenna elements connected to respective transceiver chains, wherein each transceiver chain comprises a frequency converter operated using a respective local oscillator signal provided by a respective phase-locked loop.

The method comprises controlling the respective phase-locked loop of one or more transceiver chain to generate the respective local oscillator signal with a respective phase offset for mitigation of local oscillator leakage through the frequency converter.

In some embodiments, the method further comprises applying, for each transceiver chain with a non-zero respective phase offset, a corresponding phase adjustment of a signal for frequency conversion.

In some embodiments, any of the above aspects may additionally have features identical with or corresponding to any of the various features as explained above for any of the other aspects.

An advantage of some embodiments is that alternative approaches to mitigation of local oscillator leakage are provided.

An advantage of some embodiments is that dynamic mitigation of local oscillator leakage is enabled.

An advantage of some embodiments is that approaches to mitigation of local oscillator leakage are provided which are suitable in beam-forming scenarios where the spatial direction of communication varies quickly and/or over a wide angular space.

An advantage of some embodiments is that no centered signal tracking is needed.

An advantage of some embodiments is that the approaches are inherently free from mismatch problems.

An advantage of some embodiments is that information carried by a centered signal component is not adversely affected by the mitigation.

An advantage of some embodiments is that the general performance of the communication may be improved compared to prior art solutions (e.g., one or more of the following may be achieved: increased signal-to-interference ratio (SIR), increased throughput, increased peak rate, increased capacity, etc.).

An advantage of some embodiments is that mitigation is provided of undesired signal parts, arising from un-intentional DC offsets at baseband mixing with the local oscillator.

BRIEF DESCRIPTION OF THE DRAWINGS

Further objects, features and advantages will appear from the following detailed description of embodiments, with reference being made to the accompanying drawings. The drawings are not necessarily to scale, emphasis instead being placed upon illustrating the example embodiments.

DETAILED DESCRIPTION

As already mentioned above, it should be emphasized that the term "comprises/comprising" (replaceable by "includes/including") when used in this specification is taken to specify the presence of stated features, integers, steps, or components, but does not preclude the presence or addition of one or more other features, integers, steps, components, or groups thereof. As used herein, the singular forms "a", "an" and "the" are intended to include the plural forms as well, unless the context clearly indicates otherwise.

Embodiments of the present disclosure will be described and exemplified more fully hereinafter with reference to the accompanying drawings. The solutions disclosed herein can, however, be realized in many different forms and should not be construed as being limited to the embodiments set forth herein.

Generally, when antenna elements are referred to herein, they may be understood as radiating elements of one or more multi-antenna arrangements (e.g., one or more antenna arrays, one or more antenna panels, or similar). An example of a multi-antenna arrangement is an advanced antenna system (AAS).

In the following, embodiments will be described where approaches to mitigation of local oscillator leakage are provided. The local oscillator leakage is typically leakage, through a frequency converter, of a local oscillator signal used to operate the frequency converter.

Some embodiments may be particularly suitable for multi-antenna transceivers configured to use beamformed transmission and/or reception for communication.

Figure 1:
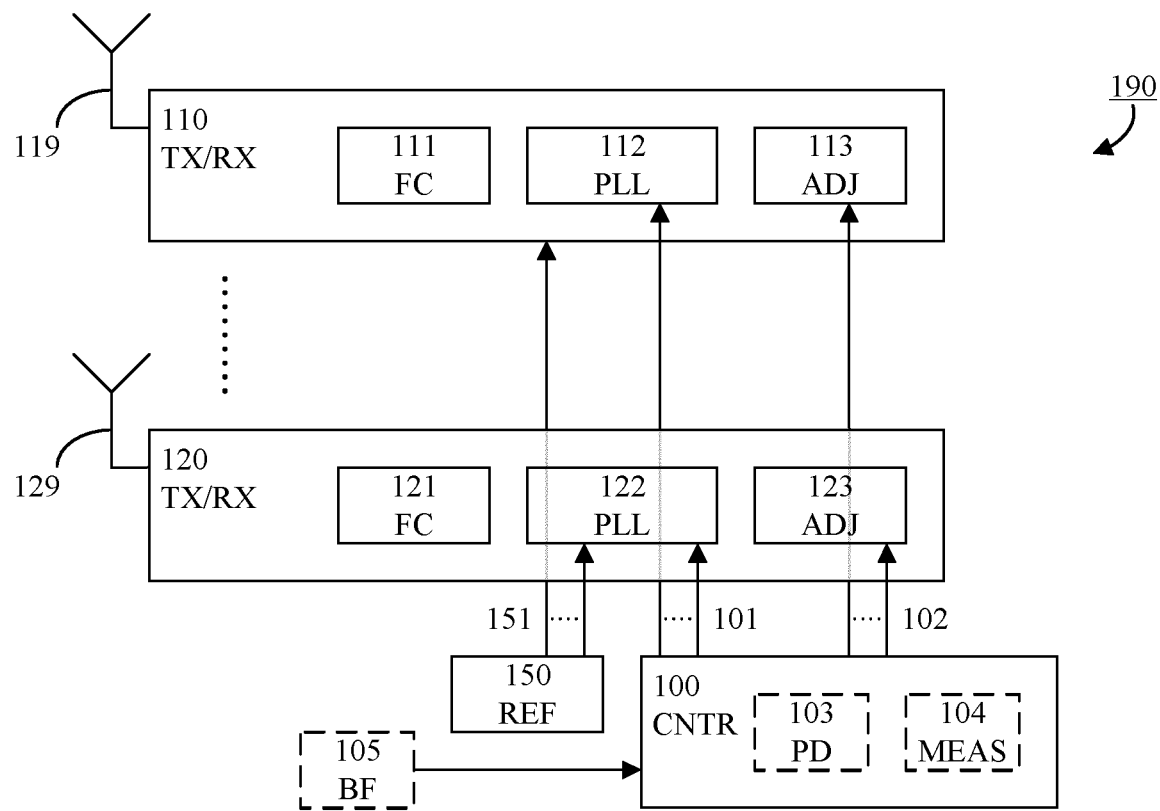
FIG. 1 is a schematic block diagram illustrating an example arrangement according to some embodiments.

FIG. 1 schematically illustrates an example arrangement 190 according to some embodiments. The example arrangement 190 is for a multi-antenna transceiver having a plurality of antenna elements 119, 129 connected to respective transceiver chains (TX/RX) 110, 120. The plurality of antenna elements may be arranged in one or more multi-antenna arrangements.

Each transceiver chain comprises a frequency converter (FC; e.g., frequency converter circuitry, such as one or more mixers) 111, 121 operated using a respective local oscillator signal provided by a respective phase-locked loop (PLL; e.g., phase-lock circuitry) 112, 122. The frequency converter may be an up-converter (e.g., in a transmission path of a transceiver chain) or a down-converter (e.g., in a receiver path of a transceiver chain). The respective PLL typically provides the respective local oscillator signal based on a reference local oscillator signal 151 provided by a reference local oscillator (REF; e.g., local oscillator circuitry) 150.

The respective PLL may be comprised in, or otherwise associated with (e.g., connectable, or connected, to) the respective transceiver chain.

The arrangement 190 comprises an apparatus for mitigation of local oscillator leakage. The apparatus comprises a controller (CNTR; e.g., controlling circuitry or a control module) 100. In various embodiments, the apparatus may further comprise one or more of: the plurality of antenna elements 119, 129, the respective transceiver chains 110, 120, the respective phase-locked loops 112, 122, and the reference local oscillator 150.

The apparatus and/or the arrangement may be comprisable, or comprised, in a multi-antenna transceiver. In various embodiments, the multi-antenna transceiver may further comprise one or more of: the plurality of antenna elements 119, 129, the respective transceiver chains 110, 120, the respective phase-locked loops 112, 122, and the reference local oscillator 150.

The multi-antenna transceiver may be comprisable, or comprised, in a wireless communication device (e.g., a radio access network node or a user equipment, UE).

The controller 100 is configured to cause control of the respective phase-locked loop 112, 122 of one or more (e.g., one, some, or all; as suitable) transceiver chain 110, 120 to generate the respective local oscillator signal (for use by the respective frequency converter 111, 121) with a respective phase offset. The control of the respective PLL may be achieved by control signals 101 from the controller to each respective PLL.

Generally, the respective phase offset may be in relation to the respective local oscillator signal of at least one other transceiver chain and/or in relation to a default local oscillator signal of the transceiver chain and/or in relation to the reference local oscillator signal 151.

The respective phase offset is for mitigation of local oscillator leakage through the frequency converter.

Typically, the mitigation of local oscillator leakage through the frequency converter comprises reduction of local oscillator leakage emission in a spatial direction corresponding to a communication beam of the multi-antenna transceiver. Such reduction may, for example, be achieved by broadening a main lobe of the local oscillator leakage emission and/or by steering of a main lobe of local oscillator leakage emission in another direction than the spatial direction of the communication beam of the multi-antenna transceiver.

The control of the respective phase-locked loop may comprise dynamic adjustment of the respective phase offset. Thereby, the spatial pattern of the local oscillator leakage emission may be dynamically changed over time (e.g., to accommodate changes in the spatial direction(s) of one or more communication beams of the multi-antenna transceiver and/or to reduce the time-average of local oscillator leakage emission experienced by a communication beam). In some approaches, the dynamic adjustment aims to avoid that local oscillator leakage emission hits a communication beam (e.g., by steering a main lobe of the local oscillator leakage emission away from a main lobe of the communication beam). In some approaches, the dynamic adjustment aims to lower the time-average of local oscillator leakage emission hitting a communication beam (e.g., spatially spreading out the local oscillator leakage emission over time so that, even if the communication beam is intermittently hit by substantial local oscillator leakage emission, the maximum possible time-average of local oscillator leakage emission hitting a communication beam is reduced).

Any known or future approach for selecting the respective phase offset(s) for achieving mitigation of local oscillator leakage may be applied (e.g., any known or future selection of the respective phase offset(s) such that the local oscillator leakage emission is controlled as exemplified herein). Some suitable choices of the respective phase offset will be exemplified further below.

In some embodiments, mitigation of local oscillator leakage through the frequency converter is accomplished by steering of a main lobe of local oscillator leakage emission in another direction than the (main) direction(s) used by the communication beam(s) of the multi-antenna transceiver.

Thus, the control of the respective phase-locked loop is responsive to (e.g., based on information regarding) a spatial direction of a communication beam of the multi-antenna transceiver. The communication beam of the multi-antenna transceiver may have a static direction or a dynamically chancing direction. The communication beam of the multi-antenna transceiver may comprise one or more communication beams (e.g., different transmission beams directed towards different receiver devices).

In addition to steering the main lobe of local oscillator leakage emission in another direction than the spatial direction of the communication beam of the multi-antenna transceiver, the controller may be configured to use the control of the respective phase-locked loop to cause placing of a null of the local oscillator leakage emission in association with the spatial direction of the communication beam of the multi-antenna transceiver. For example, the controller may be configured to use the control of the respective phase-locked loop to cause placing of a null of the local oscillator leakage emission in the spatial direction of the communication beam of the multi-antenna transceiver, or in a vicinity thereof.

When there are two or more communication beams with different spatial directions, it may be desirable to place a null of the local oscillator leakage emission in association with each of the spatial directions of the communication beams. Alternatively, a null of the local oscillator leakage emission may be placed in association with only some (e.g., one) of the spatial directions of the communication beams. In the latter case, a communication beam associated with relatively strict constraints regarding performance (e.g., a relatively high order modulation, a relatively high information rate, or similar) may be subject to the placing of the null. In some embodiments, only communication beam(s) with a frequency interval overlapping the local oscillator leakage may be subject to the placing of the null(s).

Generally, any known or future approach may be applied for selecting the respective phase offset(s) to cause steering of the main lobe and/or placing of the null(s) of local oscillator leakage emission in relation to the spatial direction of the communication beam of the multi-antenna transceiver.

In some embodiments, the local oscillator leakage emission may be tilted relative its default orientation by application of systematic phase offsets. For example, the respective phase offsets of the transceiver chains may be linearly increasing (or decreasing) along an antenna array comprising the plurality of antenna elements. Thus, the respective phase offsets may be selected as uniformly spaced samples of a ramp function. The larger the difference between adjacent phase offset values, the more prominent the tilt gets.

The control of the respective phase-locked loop may be responsive to a measured spatial pattern of the local oscillator leakage emission. To this end, the controller may be further configured to cause performance of measurements to determine the spatial pattern of the local oscillator leakage emission (e.g., location(s) of main lobe, null(s), other lobes, etc.). The measurements may be carried out when all respective phase offsets have the same value (e.g., zero) and the respective phase offsets to be applied may be determined therefrom. Alternatively or additionally, the measurements may be carried out with respective phase offsets applied (i.e., when at least two respective phase offsets have different values) and the respective phase offsets may be adjusted based on the measurements.

Generally, any known or future approach may be applied for selecting the respective phase offset(s) to cause broadening of the main lobe of the local oscillator leakage emission. For example, the respective phase offsets may be selected to spread the local oscillator leakage emission uniformly over (i.e., having the same emission pattern as) the emission pattern of the plurality of antenna elements (e.g., over the emission pattern of an antenna array or an antenna panel).

In some embodiments, the main lobe of the local oscillator leakage emission may be broadened by application of principles for generating a broadcast beam.

In some embodiments, the main lobe of the local oscillator leakage emission may be broadened by application (over time and/or over the arrangement of the plurality of antenna elements) of pseudo-random respective phase offsets. The pseudo-random respective phase offsets may, for example, be selected from the interval]$-\pi; \pi$], or [0; $2\pi$[, or any other phase interval corresponding to a full period. Alternatively or additionally, the pseudo-random respective phase offsets may, for example, be uniformly distributed.

In some embodiments, the controller is configured to cause generation, over time, of a sequence of different respective phase offsets for each of the transceiver chains. Thus, a transceiver chain switches through a sequence of respective phase offsets, wherein at least some respective phase offsets of the sequence are different. For example, the respective phase offsets of the sequence may be pseudo-random phase offsets, uniformly distributed over a phase interval corresponding to a full period. All transceiver chains may apply respective (same or different) sequences.

In some embodiments, the respective phase offsets for the transceiver chains comprise a collection of different respective phase offsets randomly spread along an antenna array comprising the plurality of antenna element. Thus, the transceiver chains apply respective phase offsets, wherein at least some respective phase offsets are different. For example, the respective phase offsets of the collection may be pseudo-random phase offsets, uniformly distributed over a phase interval corresponding to a full period.

Generally, respective phase offset values (e.g., sequences and/or collections) for broadening the main lobe of the local oscillator leakage emission may be pre-calculated and stored in a memory of the multi-antenna transceiver.

In some embodiments, broadening the main lobe of the local oscillator leakage emission may be achieved by letting the local oscillator leakage emission have a distribution which is only shaped by default emission pattern and directivity of the antenna panel or antenna array. In some scenarios, broadening the main lobe of the local oscillator leakage emission in this way may lead to that a signal quality metric—e.g., the worst case signal-to-interference-noise-and-distortion ratio (SINDR) or the error vector magnitude (EVM)—is improved (i.e., increased SINDR and/or decreased EVM; typically SINDR=20 $\log_{10}$EVM). For example, the SINDR may be increased by 10 $\log_{10}$ N, where N represents the number of antenna elements (typically because the EVM contribution due to LO-leakage is reduced by this amount). Of course, the total benefit of LO-leakage mitigation may generally depend on how prominent the LO-leakage is in the signal quality budget.

Since the signal for frequency conversion (e.g., the received signal of a receiver path or the signal for transmission or a transmitter path) is typically also affected by the respective phase offsets of the respective local oscillator signals, the controller 100 may be further configured to cause a corresponding phase adjustment of a signal for frequency conversion, at least for the transceiver chains with a non-zero respective phase offset. Typically, the phase adjustment of a transceiver chain has a same magnitude and an opposite sign as the respective phase offset for that transceiver chain.

The phase adjustment may, for example, be achieved by control signals 102 from the controller to a respective adjuster (ADJ; e.g., adjustment circuitry) 113, 123 of each transceiver chain.

The adjustment may be performed before (upstream of) or after (downstream of) the, typically analog, frequency conversion, as suitable. In a receiver path, the adjustment is typically performed after the frequency conversion. In a transmitter path, the adjustment is typically performed before the frequency conversion.

The phase adjustment may be performed in a digital domain. Furthermore, the phase adjustment may be performed in a time domain or in a frequency domain. In some embodiments, the phase adjustment is performed partly in a time domain and partly in a frequency domain.

An example implementation of phase adjustment performed in either the time domain or the frequency domain comprises enforcing a rotation of the complex-valued baseband signal, wherein the rotation corresponds to the phase adjustment.

An example implementation of phase adjustment performed in the time domain comprises controlling a numerically controlled oscillator (NCO) of the transceiver chain.

An example implementation of phase adjustment performed in the frequency domain comprises controlling an input to an inverse fast Fourier transformer (IFFT) of the transceiver chain.

In some embodiments, the controller 100 comprises, or is otherwise associated with (e.g., connectable, or connected, to), a phase determiner (PD; e.g., phase determining circuitry or a phase determination module) 103. The phase determiner may be configured to determine the respective phase offsets and/or the corresponding phase adjustment. Alternatively or additionally, the phase determiner may be configured to provide the control signals 101 and/or 102.

Generally, the control signals 101 and/or 102 may comprise any information indicative of the respective phase offsets and/or the corresponding phase adjustments, respectively. For example, the control signals 101 may carry the respective phase offsets, or an index thereof, and the control signals 102 may carry the corresponding phase adjustments, or an index thereof.

In some embodiments, the content of the control signals 102 is identical to the content of the control signals 101 (e.g., carrying the same index for a particular transceiver chain, wherein the index is indicative of the respective phase offset and the corresponding phase adjustment, or carrying the respective phase offset for a particular transceiver chain, wherein the respective phase offset is implicitly indicative of the corresponding phase adjustment, or carrying the phase adjustment for a particular transceiver chain, wherein the phase adjustment is implicitly indicative of the respective phase offset).

In some embodiments, the controller 100 comprises, or is otherwise associated with (e.g., connectable, or connected, to), a measurer (MEAS; e.g., measuring circuitry or a measurement module) 104. The measurer may be configured to measure the spatial pattern of the local oscillator leakage emission.

In some embodiments, the phase determiner 103 is configured to determine the respective phase offsets and/or the corresponding phase adjustment based on the spatial pattern of the local oscillator leakage emission as measured by the measurer 104.

In some embodiments, the controller 100 comprises, or is otherwise associated with (e.g., connectable, or connected, to), a beamformer (BF; e.g., beamforming circuitry or a beamformer module) 105. The beamformer may be configured to provide spatial direction(s) of communication beam(s) of the multi-antenna transceiver.

Figure 2:
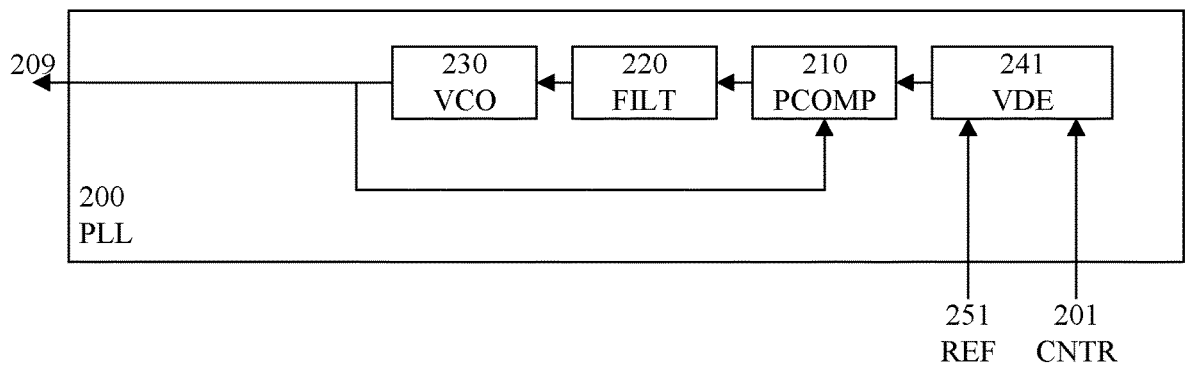
FIG. 2 is a collection of schematic block diagrams illustrating various example phase-locked loops according to some embodiments.
Figure 2:
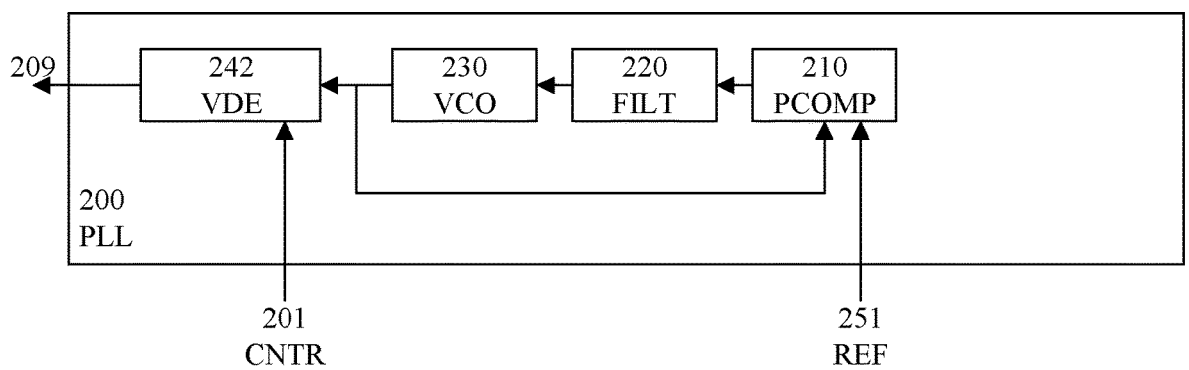
Figure 2:
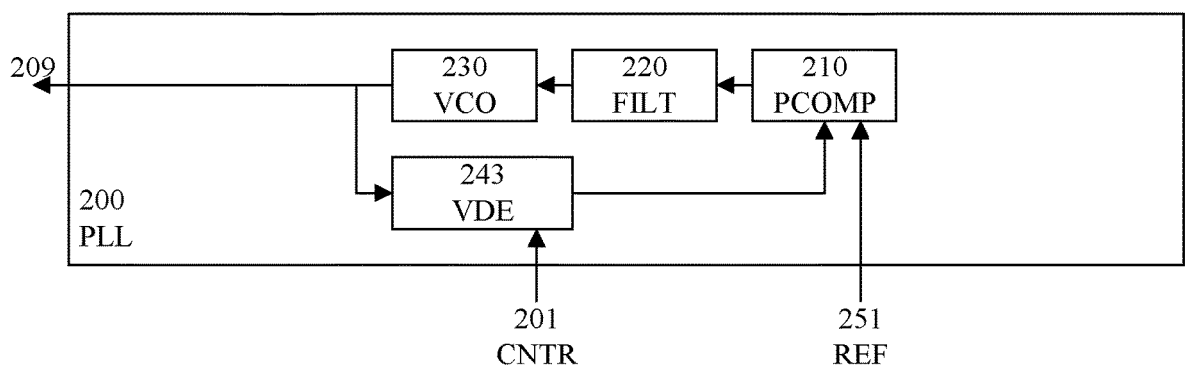

FIG. 2 schematically illustrates three example phase-locked loops (PLL) 200 according to some embodiments. Any one of these example PLL:s may be used as the PLL: 112, 122 of FIG. 1, for example.

The example PLL:s 200 are configured to generate the respective local oscillator signal 209 for use in the frequency conversion (compare with 111, 121 of FIG. 1), based on a reference local oscillator signal 251 (compare with 151 of FIG. 1).

The example PLL:s 200 are further configured to be controlled to generate the respective local oscillator signal 209 with a respective phase offset. This control is exercised through a control signal 201 (compare with 101 of FIG. 1).

In similarity with prior art PLL:s, the example PLL:s 200 comprise a phase comparator (PCOMP; e.g., phase comparing circuitry or a phase comparison module) 210 configured to compare the phases of an input signal and a feedback signal, a low-pass filter (FILT; e.g., filtering circuitry or a filter module) 220 configured to filter the output from the phase comparator, and a voltage-controlled oscillator (VCO; e.g., oscillating circuitry or an oscillator module) 230 configured to provide a local oscillator signal based on the filtered output from the phase comparator.

Each of the example PLL:s 200 is associated with a respective variable delay element (VDE; e.g., delay circuitry or a delay module) 241, 242, 243. The control of the PLL:s is exercised by controlling the delay of the variable delay element. Thus, the control signal 201 is input to the variable delay element.

In part (a) of FIG. 2, the variable delay element 241 is arranged at an input of the PLL and is configured to delay a reference signal input (e.g., the reference local oscillator signal 251) of the PLL before the reference signal is input to the phase comparator 210. In this example, the output of the voltage-controlled oscillator 230 is used as feedback signal and is directly used as the local oscillator signal 209.

In part (b) of FIG. 2, the variable delay element 242 is arranged at an output of the PLL and is configured to delay output of the voltage-controlled oscillator 230 before providing it as the local oscillator signal 209. In this example, the reference signal input (e.g., the reference local oscillator signal 251) is directly input to the phase comparator 210, and the output of the voltage-controlled oscillator 230 is directly used as feedback signal.

In part (c) of FIG. 2, the variable delay element 243 is arranged within the PLL—in the feedback path—and is configured to delay the feedback signal before providing it to the phase comparator 210. In this example, the reference signal input (e.g., the reference local oscillator signal 251) is directly input to the phase comparator 210; the output of the voltage-controlled oscillator 230 is directly used as the local oscillator signal 209, and is input to the variable delay element 243 for provision of the feedback signal.

There are other alternatives for controlling the PLL to generate the respective local oscillator signal with a respective phase offset for mitigation of local oscillator leakage. Some of these alternatives comprise manipulation of the internal operation of the PLL.

For example, the control signal 201 may be used to control the shift in time of a control word sequence of a divider of the respective phase-locked loop (the divider is not shown in FIG. 2 but may typically be arranged in the feedback path of the PLL). Example implementations of control word sequence shift of a PLL divider may be found in "A 28-nm FD-SOI 115-fs Jitter PLL-Based LO System for 24-30-GHz Sliding-IF 5G Transceivers", S. Ek, et al., IEEE Journal of Solid-State Circuits, vol. 53, No. 7, July 2018, pp. 1988-2000.

Alternatively or additionally, the control signal 201 may be used to control addition of an offset to the output of the phase comparator 210 of the PLL.

An advantage of the latter two approaches is that no delays of the LO signal itself are introduced.

Controlling the phase offset of the PLL by manipulation of the internal operation of the PLL may generally be more accurate than controlling the phase offset using a separate phase shifting block external to the PLL.

Figure 3:
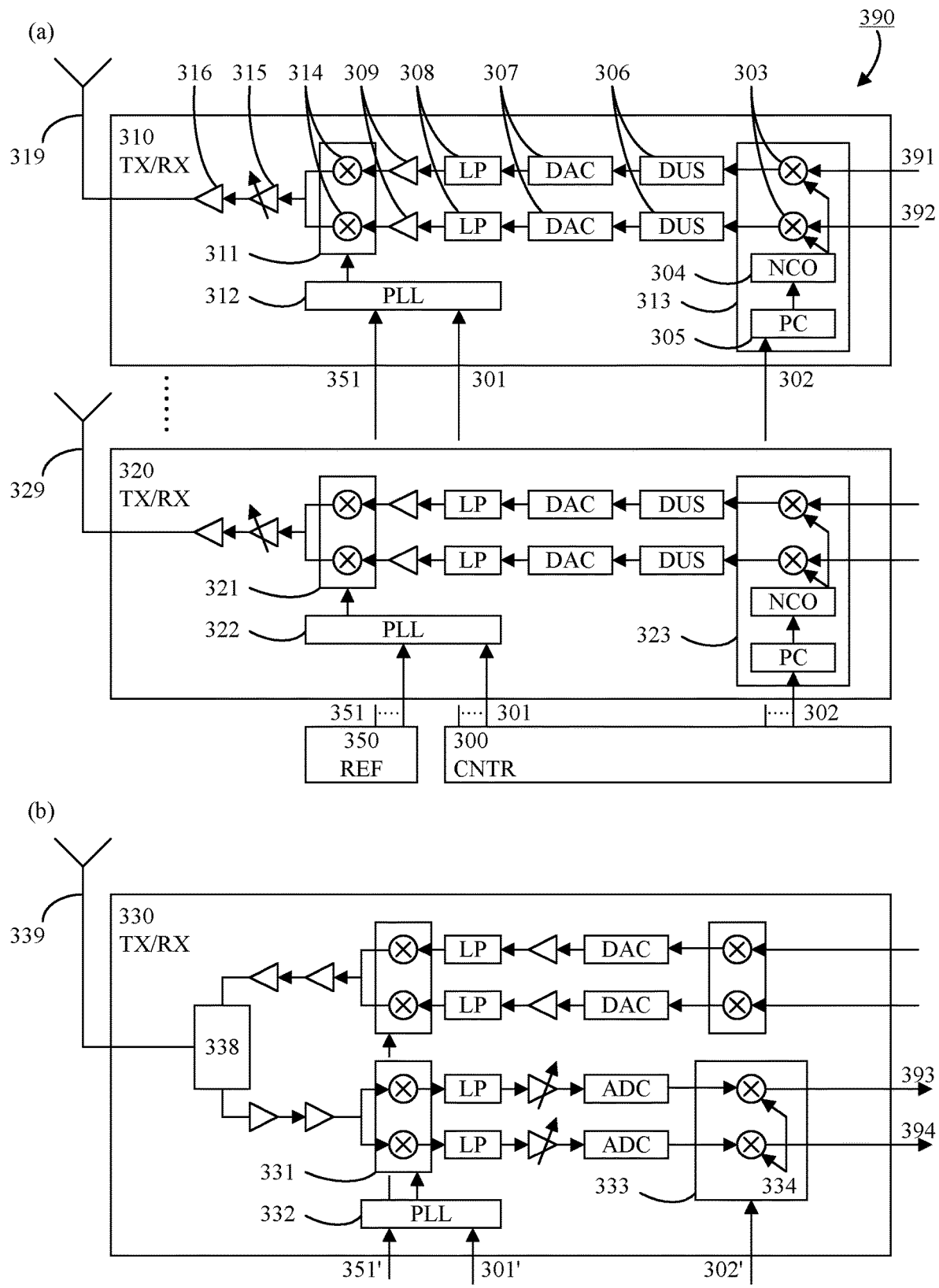
FIG. 3 is a collection of schematic block diagrams illustrating various example arrangements according to some embodiments.

Part (a) of FIG. 3 schematically illustrates an example arrangement 390 according to some embodiments. The arrangement 390 may be seen as an implementation of the arrangement 190 of FIG. 1. The arrangement 390 is for a multi-antenna transceiver having a plurality of antenna elements 319, 329 (compare with 119, 129 of FIG. 1) connected to respective transceiver chains (TX/RX) 310, 320 (compare with 110, 120 of FIG. 1). For simplicity of illustration, only the transmitter path of the transceiver chains 310, 320 is shown in part (a) of FIG. 3.

It should be understood that, generally, a transceiver chain may comprise (only) a transmitter path, (only) a receiver path, or (both) a transmitter path and a receiver path.

Each transceiver chain comprises a frequency converter 311, 321 (compare with 111, 121 of FIG. 1) in the form of in-phase and quadrature mixers 314, operated using a respective local oscillator signal (compare with 209 of FIG. 2) provided by a respective PLL 312, 322 (compare with 112, 122 of FIGS. 1 and/or 200 of FIG. 2). In this example, the frequency converters 311, 321 are up-converters in transmission paths of the transceiver chains. The respective PLL provides the respective local oscillator signal based on a reference local oscillator signal 351 (compare with 151 of FIG. 1) provided by a reference local oscillator (REF) 350 (compare with 150 of FIG. 1 and 250 of FIG. 2).

The arrangement 390 comprises an apparatus for mitigation of local oscillator leakage. The apparatus comprises a controller (CNTR) 300 (compare with 100 of FIG. 1). In various embodiments, the apparatus may further comprise one or more of: the plurality of antenna elements 319, 329, the respective transceiver chains 310, 320, the respective phase-locked loops 312, 322, and the reference local oscillator 350.

Similarly to FIG. 1, the apparatus and/or the arrangement may be comprisable, or comprised, in a multi-antenna transceiver.

The controller 300 is configured to cause control of the respective phase-locked loop 312, 322 of one or more transceiver chain 310, 320 to generate the respective local oscillator signal (for use by the respective frequency converter 311, 321) with a respective phase offset. The control of the respective PLL may be achieved by control signals 301 (compare with 101 of FIG. 1 and 201 of FIG. 2) from the controller to each respective PLL.

The respective phase offset is for mitigation of local oscillator leakage through the frequency converter. Example respective phase offsets elaborated on in connection with FIG. 1 are applicable also in this example.

The controller 300 may be further configured to cause a phase adjustment—corresponding to the respective phase offset—of a signal for frequency conversion, at least for the transceiver chains with a non-zero respective phase offset. Typically, the phase adjustment of a transceiver chain has a same magnitude and an opposite sign as the respective phase offset for that transceiver chain.

The phase adjustment may be achieved by control signals 302 (compare with 102 of FIG. 1) from the controller to a respective adjuster 313, 323 (compare with 113, 123 of FIG. 1) of each transceiver chain. The adjuster may, for example, be implemented as part of a digital frequency translator as illustrated in part (a) of FIG. 3.

In this example, the adjustment is performed before (upstream of) the frequency conversion in the transmitter path, in a digital time domain, by controlling a numerically controlled oscillator (NCO) 304 of the transceiver chain.

Following the signal flow of the transmitter path of the transceiver chain 310, in-phase and quadrature input signals 391, 392 are first phase adjusted in the adjuster 313. The phase adjuster is configured to let the control signal 302 cause a phase controller (PC) 305 to control the NCO 304 such that the phase adjustment is executed by a digital frequency translator (digital mixers, e.g., implementing a complex multiplication) 303.

The NCO may be implemented as a look-up table storing (a portion of) a sine function and/or (a portion of) a cosine function. By controlling the addressing of the look-up table of the NCO, the digital frequency translator is configured herein to add a phase offset.

Then, the in-phase and quadrature signals are processed by respective digital up-samplers (DUS) 306, digital-to-analog converters (DAC) 307, low-pass filters (LP) 308, and amplifiers 309, before being input to the in-phase and quadrature mixers 314 of the up-converter 311.

Generally, digital up-samplers may be applied to increase the sample rate (e.g., by interpolation, zero insertion, filtering, etc.), and may be applied before and/or after digital frequency translations.

When up-converted, the resulting signal is processed by a variable amplifier 315 and a power amplifier (PA) 316, and transmitted by antenna element 319.

It should be noted that the transmitter path components illustrated in part (a) of FIG. 3 are merely examples, and that some embodiments may be equally applicable in other transmitter path implementations.

Part (b) of FIG. 3 schematically illustrates an example transceiver chain 330 connected to an antenna element 339. For example, the transceiver chain 330 may be seen as an implementation of each of the transceiver chains 110, 120 of FIG. 1 and/or may be used in any suitable/adjusted combination with the transceiver chains 310, 320 of part (a) FIG. 3.

The transceiver chain 330 comprises a transmitter path and a receiver path; both connected to the antenna element 339 via a switching or duplexing element 338.

The transmitter path comprises a frequency translator (e.g., functioning as a phase adjuster), digital-to-analog converters (DAC), amplifiers, low-pass filters (LP), in-phase and quadrature mixers (functioning as up-converter), and power amplifiers. Principles described earlier with regard to the transmitter path are applicable here also, and the transmitter path is not elaborated on further for this example.

The receiver path comprises a frequency converter 331 (compare with 111, 121 of FIG. 1) in the form of in-phase and quadrature mixers, operated using a local oscillator signal (compare with 209 of FIG. 2) provided by a PLL 332 (compare with 112, 122 of FIGS. 1 and/or 200 of FIG. 2). In this example, the frequency converter 331 is a down-converter. The PLL provides the local oscillator signal based on a reference local oscillator signal 351' (compare with 151 of FIG. 1) provided by a reference local oscillator (compare with 150 of FIG. 1 and 250 of FIG. 2).

The transceiver chain 330 may be controllable by a controller, for mitigation of local oscillator leakage.

The controller is configured to cause control of the phase-locked loop 332 to generate the local oscillator signal (for use by the frequency converter 331) with a phase offset. The control of the PLL may be achieved by control signal 301' (compare with 101 of FIG. 1 and 201 of FIG. 2).

The phase offset is for mitigation of local oscillator leakage through the frequency converter. Example phase offsets elaborated on in connection with FIG. 1 are applicable also in this example.

The controller may be further configured to cause a phase adjustment—corresponding to the phase offset—of a signal for frequency conversion, at least when the transceiver chain uses a non-zero phase offset. Typically, the phase adjustment of a transceiver chain has a same magnitude and an opposite sign as the phase offset.

The phase adjustment may be achieved by control signal 302' (compare with 102 of FIG. 1) from the controller to an adjuster 333 (compare with 113, 123 of FIG. 1).

In this example, the adjustment is performed after (downstream of) the frequency conversion in the receiver path, in a digital time domain (e.g., by enforcing a rotation 334 of the complex-valued baseband signal).

Following the signal flow of the receiver path of the transceiver chain 330, the received signal is processed by initial low noise amplifiers (LNA), before being input to the in-phase and quadrature mixers of the down-converter 331. The down-converted signals are then processed by low-pass filters (LP), variable amplifiers, and analog-to-digital converters (ADC), before being phase adjusted in the adjuster 333 to produce the digital in-phase and quadrature output signals 393, 394.

It should be noted that the transmitter path components and the receiver path components illustrated in part (b) of FIG. 3 are merely examples, and that some embodiments may be equally applicable in other transceiver chain implementations.

Figure 4:
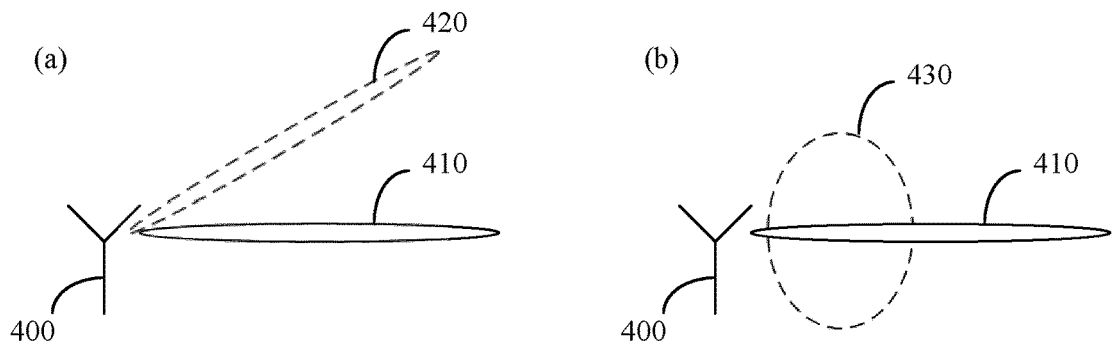
FIG. 4 is a collection of schematic drawings illustrating various principles according to some embodiments.

FIG. 4 schematically illustrates various principles for mitigation of local oscillator leakage by reduction of local oscillator leakage emission in a spatial direction corresponding to a communication beam of a multi-antenna transceiver. In FIG. 4, the multi-antenna transceiver is schematically represented by an antenna arrangement 400, and a communication beam of a multi-antenna transceiver is shown as 410.

Reduction of local oscillator leakage emission in the spatial direction corresponding to the communication beam 410 may be achieved by steering of a main lobe 420 of local oscillator leakage emission in another direction than the spatial direction of the communication beam 410, as illustrated in part (a) of FIG. 4.

Figure 5:
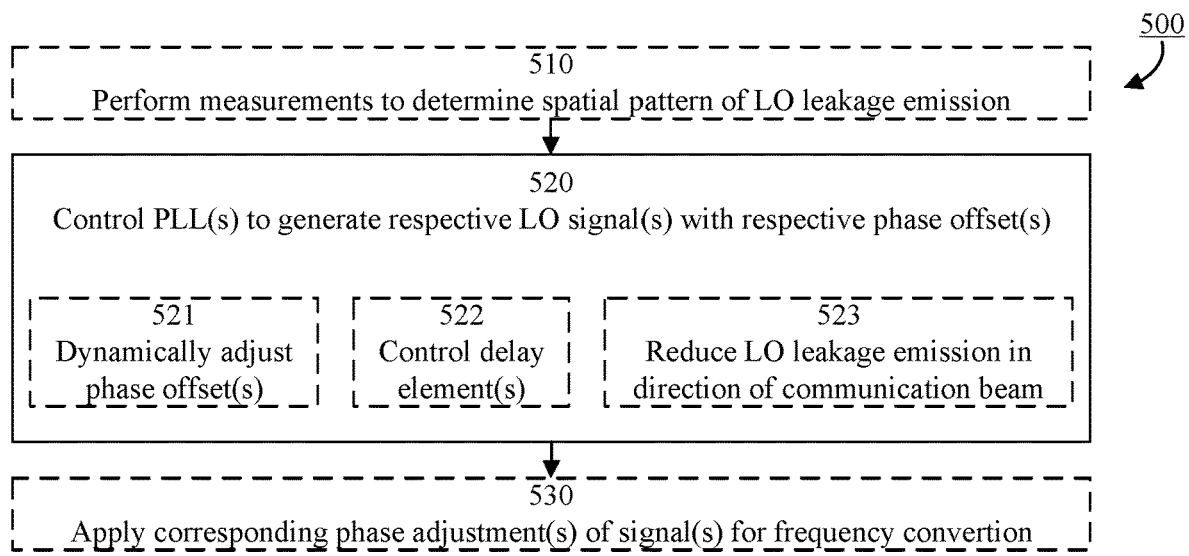
FIG. 5 is a flowchart illustrating example method steps according to some embodiments.

Alternatively or additionally, reduction of local oscillator leakage emission in the spatial direction corresponding to the communication beam 410 may be achieved by broadening a main lobe 430 of the local oscillator leakage emission, as illustrated in part (b) of FIG. 4. FIG. 5 illustrates an example method 500 according to some embodiments. The method is for a multi-antenna transceiver (e.g., any of the multi-antenna transceivers described in connection with FIGS. 1-3) having a plurality of antenna elements connected to respective transceiver chains, wherein each transceiver chain comprises a frequency converter operated using a respective local oscillator signal provided by a respective phase-locked loop. Furthermore, the method is for mitigating local oscillator leakage through the frequency converter. For example, the method may be executed by a controller (e.g., any of the controllers described in connection with FIGS. 1-3).

The method comprises controlling the respective phase-locked loop (PLL) of one or more transceiver chain to generate the respective local oscillator signal with a respective phase offset for mitigation of local oscillator leakage through the frequency converter, as illustrated by step 520.

Thus, the method comprises mitigating local oscillator leakage through the frequency converter by controlling the respective PLL to generate the respective local oscillator signal with the respective phase offset.

Controlling the respective PLL may comprise providing control signals (compare with 101 of FIG. 1) from the controller to each respective PLL.

Alternatively or additionally, controlling the respective PLL may comprise dynamically adjusting the respective phase offset, as illustrated by optional sub-step 521.

Alternatively or additionally, controlling the respective PLL may comprise controlling a variable delay element of the PLL, as illustrated by optional sub-step 522. Further details are exemplified in connection to FIG. 2.

Alternatively or additionally, controlling the respective PLL may comprise reducing local oscillator (LO) leakage emission in a spatial direction corresponding to a communication beam of the multi-antenna transceiver, as illustrated by optional sub-step 523. As described in connection with FIG. 1, such reduction may, for example, be achieved by broadening a main lobe of the local oscillator leakage emission and/or by steering of a main lobe of local oscillator leakage emission in another direction than the spatial direction of the communication beam of the multi-antenna transceiver (e.g., for placing a null of the local oscillator leakage emission in association with the spatial direction of the communication beam of the multi-antenna transceiver). Example respective phase offsets elaborated on in connection with FIG. 1 are applicable also in this example.

As illustrated by optional step 530, the method may further comprise applying, for each transceiver chain with a non-zero respective phase offset, a corresponding phase adjustment of a signal for frequency conversion. Typically, the phase adjustment of a transceiver chain has a same magnitude and an opposite sign as the respective phase offset for that transceiver chain. Applying the phase adjustment may comprise providing control signals (compare with 102 of FIG. 1) from the controller to a respective adjuster. Further details are exemplified in connection to FIG. 1.

As illustrated by optional step 510, the method may further comprise performing measurements to determine the spatial pattern of the local oscillator leakage emission. The result of the measurements may be used to control the PLL in step 520. Further details are exemplified in connection to FIG. 1.

Figure 6:
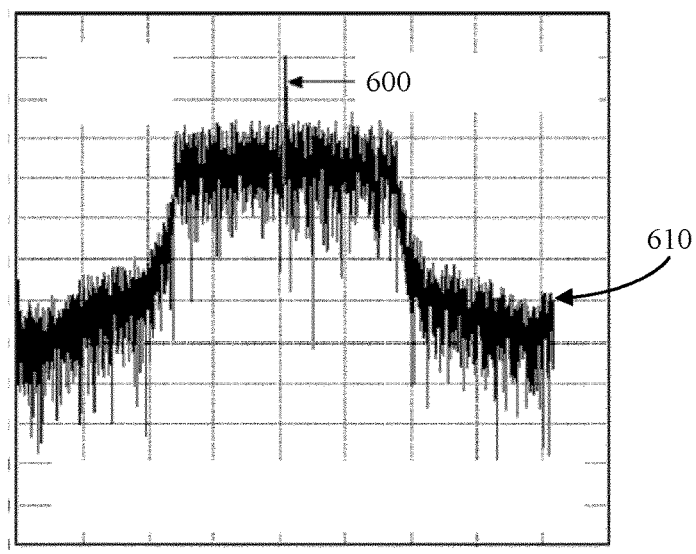
FIG. 6 is a plot illustrating example local oscillator leakage relevant to some embodiments.

FIG. 6 illustrates a frequency domain, orthogonal frequency division multiplexing (OFDM), communication transmission signal 610 with an example local oscillator leakage 600. In the plot of FIG. 6, the x-axis shows a linear frequency span from 0 MHz to 45 MHz, and the y-axis shows the spectrum power in a logarithmic scale ranging from −120 dBm to 10 dBm.

It may be noted that some embodiments are particularly suitable for fifth generation (5G) communication (e.g., as specified by the third generation partnership project, 3GPP). Various reasons for that suitability include that communication beam directions may change relatively often, that a change in communication beam direction may have a relatively large angular value, and that there may be information carried in a centered sub-carrier.

When—as in 5G—the bandwidth is relatively large (e.g., when several carriers are used in combination) and/or when several signaling layers are used, the amount of local oscillator leakage may be combined at a single centered carrier for the entire bandwidth and/or for all layers, leading to a relatively high power for the local oscillator leakage emission and/or to tracking the centered signal component being cumbersome.

When—as in 5G—relatively high frequencies are used (e.g., mm-wave frequencies), the sensitivity to mismatch between the local oscillator leakage and the cancellation signal is more prominent.

The described embodiments and their equivalents may be realized in software or hardware or a combination thereof. The embodiments may be performed by general purpose circuitry. Examples of general purpose circuitry include digital signal processors (DSP), central processing units (CPU), co-processor units, field programmable gate arrays (FPGA) and other programmable hardware. Alternatively or additionally, the embodiments may be performed by specialized circuitry, such as application specific integrated circuits (ASIC). The general purpose circuitry and/or the specialized circuitry may, for example, be associated with or comprised in an apparatus such as a wireless communication device (e.g., a user equipment, UE, or a network node).

Embodiments may appear within an electronic apparatus (such as a wireless communication device) comprising arrangements, circuitry, and/or logic according to any of the embodiments described herein. Alternatively or additionally, an electronic apparatus (such as a wireless communication device) may be configured to perform methods according to any of the embodiments described herein.

Generally, all terms used herein are to be interpreted according to their ordinary meaning in the relevant technical field, unless a different meaning is clearly given and/or is implied from the context in which it is used.

Reference has been made herein to various embodiments. However, a person skilled in the art would recognize numerous variations to the described embodiments that would still fall within the scope of the claims.

For example, the method embodiments described herein discloses example methods through steps being performed in a certain order. However, it is recognized that these sequences of events may take place in another order without departing from the scope of the claims.

Furthermore, some method steps may be performed in parallel even though they have been described as being performed in sequence. Thus, the steps of any methods disclosed herein do not have to be performed in the exact order disclosed, unless a step is explicitly described as following or preceding another step and/or where it is implicit that a step must follow or precede another step.

In the same manner, it should be noted that in the description of embodiments, the partition of functional blocks into particular units is by no means intended as limiting. Contrarily, these partitions are merely examples. Functional blocks described herein as one unit may be split into two or more units. Furthermore, functional blocks described herein as being implemented as two or more units may be merged into fewer (e.g. a single) unit.

Any feature of any of the embodiments disclosed herein may be applied to any other embodiment, wherever suitable. Likewise, any advantage of any of the embodiments may apply to any other embodiments, and vice versa.

Hence, it should be understood that the details of the described embodiments are merely examples brought forward for illustrative purposes, and that all variations that fall within the scope of the claims are intended to be embraced therein.

The invention claimed is:

1. An apparatus for a multi-antenna transceiver, the multi-antenna transceiver having a plurality of antenna elements connected to respective transceiver chains, each transceiver chain comprising a frequency converter operated using a respective local oscillator signal provided by a respective phase-locked loop, the apparatus comprising:
a controller configured to cause:
receive a measured spatial pattern of local oscillator leakage emissions; and
control the respective phase-locked loop of one or more transceiver chain to generate the respective local oscillator signal with a respective phase offset for mitigation of the measured local oscillator leakage through the frequency converter, the control of the respective phase-locked loop being responsive to a spatial direction of a communication beam of the multi-antenna transceiver.

2. The method of claim 1, wherein the control of the respective phase-locked loop comprises dynamic adjustment of the respective phase offset.

3. The apparatus of claim 1, wherein the respective phase offset is in relation to the respective local oscillator signal of at least one other transceiver chain.

4. The apparatus of claim 1, wherein the respective phase offset is in relation to a default local oscillator signal of the transceiver chain.

5. The apparatus of claim 1, wherein each respective phase-locked loop is associated with a respective variable delay element, and wherein the controller is configured to cause the control of the respective phase-locked loop by controlling the delay of the variable delay element.

6. The apparatus of claim 5, wherein the respective variable delay element is arranged at an input of the respective phase-locked loop and is configured to delay a reference signal input of the respective phase-locked loop.

7. The apparatus of claim 5, wherein the respective variable delay element is arranged at an output of the respective phase-locked loop and is configured to delay the respective local oscillator signal of the respective phase-locked loop.

8. The apparatus of claim 1, wherein the controller is configured to cause the control of the respective phase-locked loop by causing one or more of: a shift in time of a control word sequence of a divider of the respective phase-locked loop, and an addition of an offset to an output of a phase comparator of the respective phase-locked loop.

9. The apparatus of claim 1, wherein the controller is configured to use the control of the respective phase-locked loop to cause steering of a main lobe of local oscillator leakage emission in another direction than the spatial direction of the communication beam of the multi-antenna transceiver.

10. The apparatus of claim 1, wherein the controller is configured to use the control of the respective phase-locked loop to cause placing of a null of the local oscillator leakage emission in association with the spatial direction of the communication beam of the multi-antenna transceiver.

11. The apparatus of claim 1, wherein the respective phase offsets of the transceiver chains are linearly increasing along an antenna array comprising the plurality of antenna elements.

12. The apparatus of claim 1, wherein the controller is further configured to cause performance of measurements to determine the spatial pattern of the local oscillator leakage emission.

13. The apparatus of claim 1, wherein the controller is configured to use the control of the respective phase-locked loop to cause broadening of a main lobe of local oscillator leakage emission.

14. The apparatus of claim 13, wherein the controller is configured to cause generation, over time, of a sequence of different respective phase offsets for each of the transceiver chains.

15. The apparatus of claim 13, wherein the respective phase offsets for the transceiver chains comprise a collection of different respective phase offsets randomly spread along an antenna array comprising the plurality of antenna elements.

16. The apparatus of claim 14, wherein the different respective phase offsets comprise uniformly distributed phase offsets.

17. The apparatus of claim 1, wherein the controller is further configured to cause, for each transceiver chain with a non-zero respective phase offset, a corresponding phase adjustment of a signal for frequency conversion.

18. The apparatus of claim 17, wherein the phase adjustment has a same magnitude and an opposite sign as the phase offset.

19. The apparatus of claim 1, wherein each transceiver chain comprises a transmitter path wherein the frequency converter is an up-converter.

20. A method for a multi-antenna transceiver having a plurality of antenna elements connected to respective transceiver chains, each transceiver chain comprising a frequency converter operated using a respective local oscillator signal provided by a respective phase-locked loop, the method comprising:
receiving a measured spatial pattern of local oscillator leakage emissions; and
controlling the respective phase-locked loop of one or more transceiver chain to generate the respective local oscillator signal with a respective phase offset for mitigation of the measured local oscillator leakage through the frequency converter, the control of the respective phase-locked loop being responsive to a spatial direction of a communication beam of the multi-antenna transceiver.

21. An apparatus for a multi-antenna transceiver, the multi-antenna transceiver having a plurality of antenna elements connected to respective transceiver chains, each transceiver chain comprising a frequency converter operated using a respective local oscillator signal provided by a respective phase-locked loop, the apparatus comprising:
a controller configured to:
control the respective phase-locked loop of one or more transceiver chain to generate the respective local oscillator signal with a respective phase offset for mitigation of local oscillator leakage through the frequency converter, the control of the respective phase-locked loop being responsive to a spatial direction of a communication beam of the multi-antenna transceiver; and
use the control of the respective phase-locked loop to cause steering of a main lobe of local oscillator leakage emission in another direction than the spatial direction of the communication beam of the multi-antenna transceiver.

\* \* \* \* \*